United States Patent [19]
Ochii

[11] Patent Number: 5,317,532
[45] Date of Patent: May 31, 1994

[54] SEMICONDUCTOR MEMORY DEVICE HAVING VOLTAGE STRESS TESTING CAPABILITY

[75] Inventor: Kiyofumi Ochii, Yokohama, Japan

[73] Assignee: Kabushiki Kaisha Toshiba, Kawasaki, Japan

[21] Appl. No.: 848,192

[22] Filed: Mar. 10, 1992

[30] Foreign Application Priority Data

Mar. 22, 1991 [JP] Japan .................................. 3-059084

[51] Int. Cl.$^5$ .................................................. G11C 7/00
[52] U.S. Cl. .................................... 365/149; 365/201;
307/296.1; 307/296.3
[58] Field of Search ............... 365/201, 149; 371/10.1,
371/21.1, 22.5, 22.6, 67.1, 71; 309/296.1, 296.2,
296.3

[56] References Cited

U.S. PATENT DOCUMENTS

| | | | |
|---|---|---|---|
| 4,751,679 | 6/1988 | Dehganpour | 371/21.1 |
| 4,839,865 | 6/1989 | Sato et al. | 365/201 |
| 5,051,995 | 9/1991 | Tobita | 365/201 |

FOREIGN PATENT DOCUMENTS

| | | | |
|---|---|---|---|
| 60157250 | 8/1985 | Japan . | |
| 0214100 | 8/1990 | Japan | 365/201 |
| WO83/04109 | 11/1983 | PCT Int'l Appl. . | |

OTHER PUBLICATIONS

IEEE Journal of Solid-State Circuits, vol. SC-22, No. 5, Oct., 1987 pp. 643-650, "A 4-Mbit DRAM with Folded-Bit-Line Adaptive Sidewall-Isolated Capacitor (FASIC) Cell".

*Primary Examiner*—Eugene R. LaRoche
*Assistant Examiner*—Vu Le
*Attorney, Agent, or Firm*—Finnegan, Henderson, Farabow, Garrett & Dunner

[57] ABSTRACT

A semiconductor memory device which comprises memory cells arranged in rows and columns on a semiconductor substrate, each having one transistor and one capacitor, word lines each connected to memory cells in the same row, bit lines each connected to memory cells in the same column, a plate voltage generating circuit for generating a capacitor plate voltage at the time of normal operation, a negative pulse generating circuit responsive to a control signal supplied thereto at the time of voltage stress testing, for generating a pulse voltage of negative polarity, switch circuits for supplying the pulse voltage of negative polarity output from the negative pulse generating circuit, to the plate electrodes of the capacitors of all memory cells simultaneously, in place of the output of the plate voltage generating circuit, and a switch control circuit responsive to a control signal supplied thereto during voltage stress testing, for controlling the switch circuits.

2 Claims, 3 Drawing Sheets

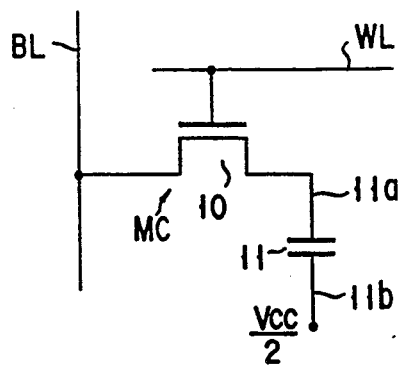
F I G. 1
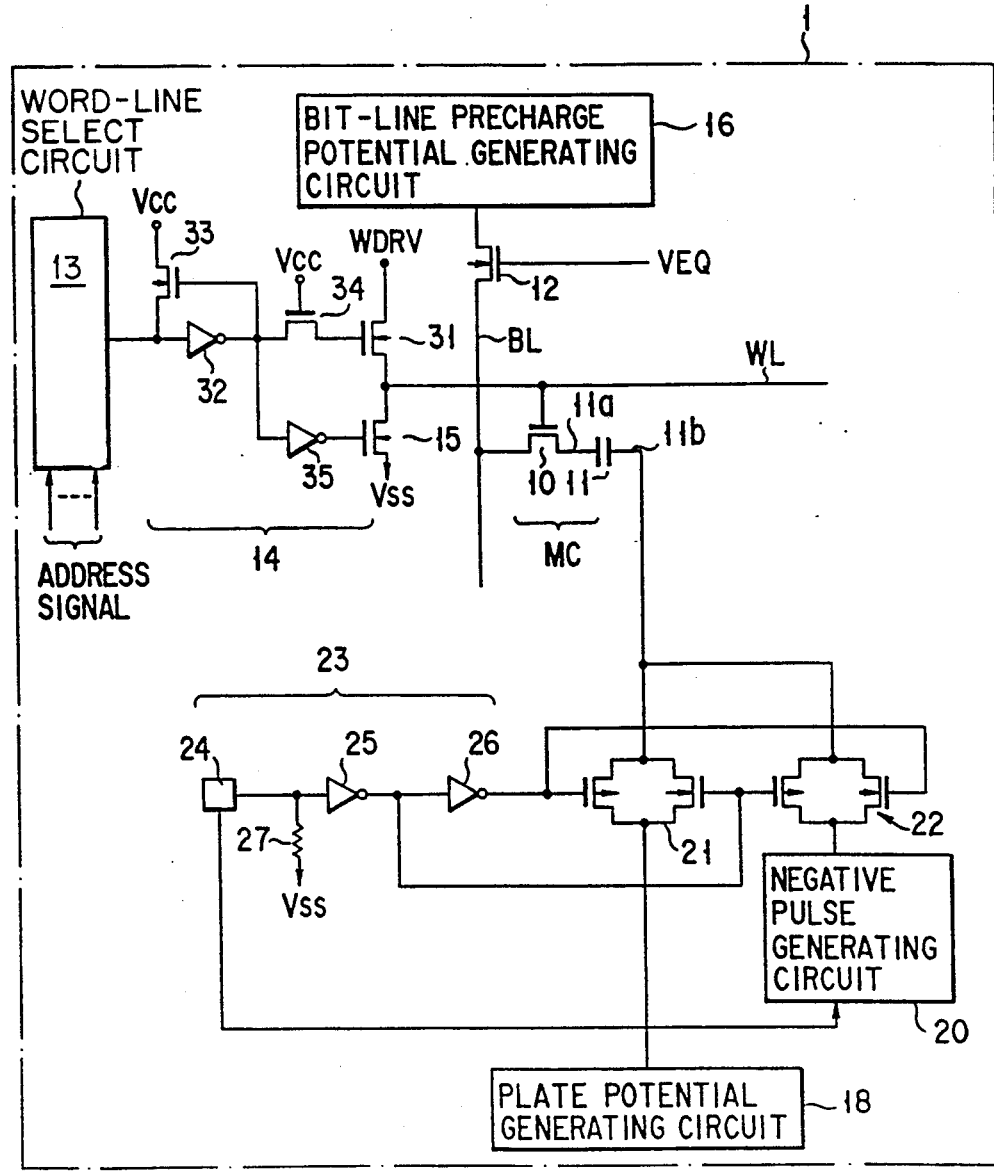
F I G. 2

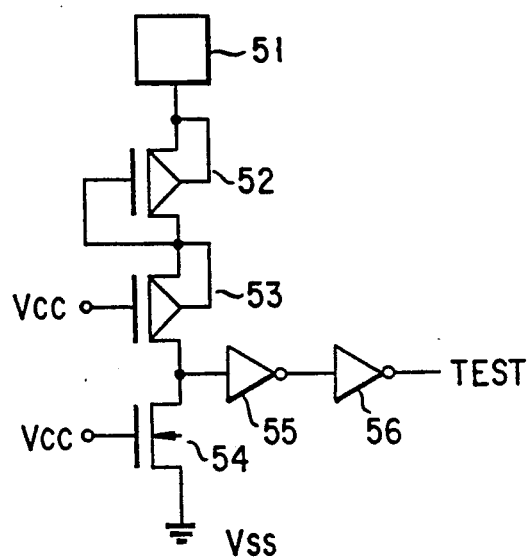
F I G. 5

SEMICONDUCTOR MEMORY DEVICE HAVING VOLTAGE STRESS TESTING CAPABILITY

BACKGROUND OF THE INVENTION

1. Field of the Invention

The present invention relates to a semiconductor memory device and, more particularly, to a dynamic random access memory (DRAM) having means for screening out defects of capacitor insulating layers of memory cells.

2. Description of the Related Art

In order to secure reliability of semiconductor devices, screening is commonly performed on the devices before their shipment, the detect potential defects in the devices and remove defective elements. The technique of screening most used is burn-in, which can implement voltage acceleration and temperature acceleration simultaneously. In burn-in screening, devices are operated at a voltage higher than their normal operating voltage and a temperature higher than a normal operating temperature. The devices thereby receive, within a short time, a stress greater than that they may receive in their early failure period under normal operating conditions. Of these devices, those which are most likely to have early failure are screened out before shipment. Thus, the devices that may fail early can be removed effectively, and only the devices which are far less likely to have early failure are delivered to customers.

Burn-in is classified into package burn-in and wafer burn-in. In package burn-in, semiconductor devices are subjected to burn-in after they have been sealed in packages as a final product. In wafer burn-in, semiconductor devices are subjected to burn-in while they are still in wafer form.

With DRAMs having a memory capacity of 1M bits or more, it is common that half of a power-supply voltage (VCC/2) is applied to the plate electrode of each memory cell capacitor during normal operation. More specifically, in a DRAM memory cell MC of FIG. 1, for example, a cell transistor 10 has its gate connected to a word line WL, its drain connected to a bit line BL, and its source connected to one terminal (charge storage node 11a) of a capacitor 11. The other terminal (plate electrode 11b) of the capacitor 11 is connected to VCC/2.

To eliminate the defect of the capacitor insulating layer rapidly during voltage stress testing for package burn-in of such a DRAM, an insulating layer of the capacitor (capacitor insulating layer) needs to be aged. A technique of aging the capacitor insulating layer is disclosed in IEEE JOURNAL OF SOLID-STATE CIRCUITS, VOL. SC-22, No. 5, OCTOBER, 1987, pp. 643–650, "A 4-M bit DRAM with Folded-Bit-Line Adaptive Sidewall-Isolated Capacitor (FASIC) Cell", FIG. 11. In this technique, the capacitor plate electrode is set at a power-supply voltage VCC, thereby aging the capacitor insulating layer.

If the insulating layer begins breaking down, and a small leakage current begins to flow, during voltage stress testing, the voltage at the charge storage node 11a of the capacitor 11 will fall, and the voltage applied to the capacitor insulating layer will also fall because the node 11a is in the floating state. When leakage current starts flowing, the voltage stress across the insulating layer falls to 7 V or less if VCC is, for example 7 V. Consequently, it is no longer possible to break down the capacitor insulating layer completely, though the layer has been broken down to some extent, or a considerably long time is required to break down the insulating layer completely.

However, the capacitor insulating layer, whose defect is limited to leakage of small current, brings about degradation of various types of memory-cell operating margins. (The most significant degradation mode is that of data holding characteristic). In many cases it is difficult to detect memory cells having such a degradation mode by means of a functional test conducted after the voltage stress testing. The less prominent such degradation, the more difficult it is to perform successful detection.

Published Unexamined Japanese Patent Application No. 59-500840 which corresponds to PCT Application U.S. 83/00515, PCT Publication No. WO 83/04109 (Nob. 24, 1983) discloses the technique of mounting a voltage-stress applying pad on a DRAM chip and connecting it to capacitor plate electrodes of all memory cells of a memory cell array in common, and applying a negative voltage ($-40$ V) to the pad from outside the chip during voltage stress testing for DRAM wafer burn-in. In this technique, the semiconductor substrate and word lines are set at ground potential VSS, whereby the capacitor insulating layers of the memory cells can be screened out efficiently within a short period of time. In this case, however, a burn-in testing device external to the wafer requires a negative power supply for supplying the negative voltage.

For a voltage stress testing for package burn-in or wafer burn-in, it is desirable that an external testing device have no negative power supply and that the gate insulating layers of cell transistors be screened efficiently within a short time, while simultaneously screening the capacitor insulating layers of memory cells.

SUMMARY OF THE INVENTION

It is therefore an object of the present invention to provide a semiconductor memory device, wherein, during voltage stress testing, a sufficient voltage stress can be simultaneously applied to capacitor insulating layers of all memory cells of a memory cell array, and capacitor insulating layers being broken down can be broken down completely or within a short time, without need of a negative power supply of an external testing device and, after the voltage stress testing, memory cells having a degradation mode can be detected by a simple functional test.

It is another object of the invention to provide a semiconductor memory device, wherein a voltage stress can be simultaneously applied between a gate and a source of a transfer-gate transistor of each memory cell of a memory cell array during voltage stress testing.

To attain the above objects, a semiconductor memory device according to an aspect of the invention comprises: a plurality of memory cells arranged in rows and columns on a semiconductor substrate, each having one transistor and one capacitor; a plurality of word lines each connected to memory cells in the same row; a plurality of bit lines each connected to memory cells in the same column; a plate voltage generating circuit for generating a capacitor plate voltage at the time of normal operation; a negative pulse generating circuit responsive to a control signal supplied thereto at the time of voltage stress testing for generating a pulse voltage of negative polarity; a switch circuit for supplying the pulse voltage of negative polarity output from the negative pulse generating circuit, to the plate electrodes of the capacitors of all memory cells simultaneously, in place of the output of the plate voltage generating circuit; and a switch control circuit responsive to a control signal supplied thereto during voltage stress testing, for controlling the switch circuit.

The pulse voltage of negative polarity has an absolute value greater than a forward voltage drop across a junction between the semiconductor substrate and an impurity diffusion region formed within the semiconductor substrate and contacting the charge storage electrode of the capacitor and varies between ground potential and a negative potential.

A semiconductor memory device according to another aspect of the invention comprises: a plurality of memory cells arranged in rows and columns on a semiconductor substrate, each having one transistor and one capacitor; a plurality of word lines each connected to memory cells in the same row; a plurality of bit lines each connected to memory cells in the same column; a plate voltage generating circuit for generating a capacitor plate voltage at the time of normal operation; a negative voltage generating circuit responsive to a control signal supplied thereto at the time of voltage stress testing, for generating a DC voltage of negative potential; a switch circuit for supplying the DC voltage of negative potential output from the negative voltage generating circuit, to the plate electrodes of the capacitors of all memory cells simultaneously, in place of the output of the plate voltage generating circuit; and a switch control circuit responsive to a control signal supplied thereto during voltage stress testing, for controlling the switch circuit.

The negative voltage has an absolute value greater than a forward voltage drop across a junction between the semiconductor substrate and an impurity diffusion region formed within the semiconductor substrate and contacting the charge storage electrode of the capacitor.

In the semiconductor memory devices according to the invention, during the voltage stress testing for screening, conducted on the devices still in a wafer form or already packaged, a control signal is supplied, without using a negative power supply of an external testing device. In the devices, a pulse voltage of negative polarity is thereby generated which varies between the ground potential VSS and a predetermined negative potential ($-Vb$), or a DC voltage of the predetermined negative potential ($-Vb$). The pulse voltage or the DC voltage of negative potential, thus generated, is applied to the plate electrodes of all memory cells of the device.

When the plate voltage of the capacitor of each memory cell is $-Vb$, a sufficient voltage stress can be applied to the capacitor insulating layers of all memory cells of the device. Hence, the capacitor insulating layers, which are being broken down, can be broken down completely or within a short time. It is therefore possible to detect the memory cells having a degradation mode, after the voltage stress testing by means of a simple functional test.

When the plate voltage ($-Vb$) changes to the ground potential VSS, the voltage Vn at the charge storage node of each memory-cell capacitor will rise by $-Vb$ from $-Vf$ due to the capacitive coupling of the capacitor. A voltage of Vb-Vf is thereby applied between the ends of the insulating layer of the capacitor. At this time the charge storage node of the capacitor is in floating state. Hence, a voltage stress is applied to the gate-source paths of all transfer-gate transistors of the memory cell array, which are connected to the word lines, provided that all word lines are set at the ground potential VSS. As a result, the transistors having defective gate insulating layers can be screened out with high efficiency.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of a memory cell of a conventional DRAM;

FIG. 2 is a circuit diagram of a part of a DRAM according to an embodiment of the present invention;

FIG. 5 is a circuit diagram of a high-voltage detecting circuit for generating a control signal for application to the switch control circuit of FIG. 2.

DETAILED DESCRIPTION OF THE PREFERRED EMBODIMENTS

Figures 3, 4:
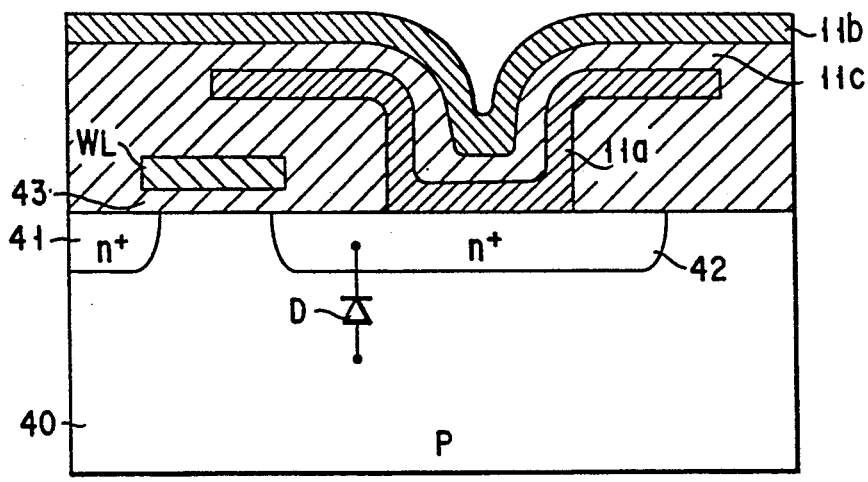
FIG. 3 is a sectional view illustrating an example of the structure of the memory cell of FIG. 2.
FIG. 4 is a timing chart for use in explanation of the operation of a voltage stress testing of the DRAM memory cell of FIG. 2.

Hereinafter, preferred embodiments of the present invention will be described, with reference to the accompanying drawings. In the drawings, like reference numerals designate like or corresponding parts shown in all figures, to thereby simplify the description.

FIG. 1 shows one of the memory cells MC of the DRAM, which are arranged in rows and columns on a semiconductor substrate, thus forming a memory cell array, one of the word lines WL of the DRAM, and one of the bit lines BL thereof intersecting with the word lines WL. The memory cell MC consists of a transfer-gate MOS transistor 10 and a capacitor 11.

FIG. 2 is a circuit diagram of the DRAM according to a first embodiment of the present invention. As can be understood from this figure, the gates of transfer-gate transistors 10 of the memory cells of the same row are connected to the same word line WL. The drains of transfer-gate transistors 10 arranged in the same column are connected to the same bit line BL. The DRAM comprises a bit-line precharge circuit 12, a word-line select circuit 13 (row decoder) which is responsive to an address signal to output a word-line select signal, and a word-line drive circuit 14. The DRAM further comprises a noise-killer NMOS transistor 15 connected between the word line and ground node, for preventing the word line from staying in the floating state while the word line remains unselected during a precharge period or an active period in normal operation and prevents the potential on the word line from exceeding the threshold voltage of the transfer-gate transistor 10 because of noise during that period. Otherwise, the data in the memory cell would be lost if the potential on the world line exceeded the threshold voltage of the transistor 10 due to noise or the like.

As is shown in FIG. 2, the DRAM further has a bit-line precharge potential generating circuit 16 for generating a bit-line precharge potential (usually VCC/2), and a plate potential generating circuit 18 for generating a capacitor plate potential (usually VCC/2) for application to plate electrodes 11b of capacitors 11 of all the memory cells.

The DRAM further comprises a negative pulse generating circuit 20, switch circuits 21 and 22 and a switch control circuit 23 on DRAM chip 1.

The negative pulse generating circuit 20 is responsive to a control signal to generate a pulse voltage of negative polarity during a voltage stress testing. The negative pulse voltage has an absolute value which is greater than the forward voltage drop Vf across a diode which is a junction formed between the semiconductor substrate and an impurity diffusion region formed within the semiconductor substrate and contacting the node 11a. The negative pulse voltage changes between ground potential VSS and a predetermined negative potential ($-Vb$).

The switch circuit 21 performs a control operation in such a way as to supply the output of the plate voltage generating circuit 18 to each of the plate electrodes 11b of the capacitors 11 of the memory cells simultaneously during normal operation, and not to supply it to the plate electrodes 11b simultaneously during voltage stress testing. In the present embodiment, the switch circuit 21 is formed of a CMOS transfer-gate connected between the output node of the plate potential generating circuit 18 and the plate electrodes 11b.

The switch circuit 22 performs a control operation in such a way as not to supply the output of the negative pulse generating circuit to each of the plate electrodes 11b simultaneously during normal operation and to supply the negative pulse voltage from the negative pulse generating circuit 20 to each of the plate electrodes 11b simultaneously during voltage stress testing in place of the output of the plate voltage generating circuit 18. In the present embodiment, the switch circuit 22 is formed of a CMOS transfer-gate connected between the output node of the negative pulse generating circuit 20 and the plate electrodes 11b.

During normal operation, the switch control circuit 23 turns the switch circuit 21 on and turns the switch circuit 22 off. During voltage stress testing, the circuit 23 is responsive to a control signal to turn the switch circuit 21 off and the switch circuit 22 on.

As is evident from FIG. 2, the switch control circuit 23 comprises a pad 24, two CMOS inverters 25 and 26, and a resistor 27. The pad 24 is provided to receive a control signal. The CMOS inverters 25 and 26 are connected in series, thus forming a series circuit which is connected to the pad 24. The resistor 27 is connected between the pad 24 and the ground node.

It will now be described how the switch control circuit 23 operates. As long as no signals are supplied to the pad 24, the pad 24 is pulled down to the ground potential by means of the resistor 27. Hence, the output of the first-stage CMOS inverter 25 and the second-stage CMOS inverter 26 remain at H and L levels, respectively, and the switch circuits 21 and 22 remain on and off, respectively. When a control signal at the H level is supplied to the pad 24, the outputs of the CMOS inverters 25 and 26 change to the L level and the H level, respectively, whereby the switch circuits 21 and 22 are turned off and on, respectively.

In the embodiment of FIG. 2, the word-line select circuit 13 is a precharge-type NAND gate. The word-line drive circuit 14 includes an NMOS transistor 31, a first CMOS inverter 32, a PMOS transistor 33, an NMOS transistor 34, and a second CMOS inverter 35. The NMOS transistor 31 is connected between a source of a word-line drive voltage WDRV and the word line WL, for driving the word line WL in response to the signal output by the word-line select circuit 13. (The voltage WDRV is a potential higher than the power-supply potential VCC.) The first CMOS inverter 32 has its input connected to the output of the word-line select circuit 13. The PMOS transistor 33 is a pull-up transistor connected between the power-supply potential VCC and the output of the word-line select circuit 13, with its gate coupled to the output of the first CMOS inverter 32. The NMOS transistor 34 is coupled between the output of the first CMOS inverter 32 and the gate of the NMOS transistor 31, with its gate connected to receive a power-supply voltage VCC. The second CMOS inverter 35 is coupled between the output of the first CMOS inverter 32 and the gate of the noise-killer NMOS transistor 15.

The normal operation of the DRAM shown in FIG. 2 will now be explained.

First, no control signals are supplied to the pad 24. The switch control circuit 23 turns the switch circuits 21 and 22 on and off, respectively. The output voltage of the plate voltage generating circuit 18 is thereby applied to the plate electrode 11b of the capacitor 11 of the memory cell MC.

As long as the row address strobe signal /RAS input to a bit-line precharge signal generator (not shown) remains inactive, a bit-line precharge signal generator (not shown) generates a precharge signal VEQ to the bit-line precharge circuit 12, turning on the circuit 12. As a result, all bit line pairs BL are precharged to the output potential of the bit-line precharge potential generating circuit 16.

When the row address strobe signal /RAS is activated, the precharge signal VEQ, which is supplied to the bit line of any memory-cell block selected, is inactivated. At the same time, the word-line select circuit 13 generates word-line selecting signals in accordance with the the logic levels represented by the address signal, thereby the desired ones of the word lines WL. When the word-line select signal supplied to the word-line drive circuit 14 is at the L level, the word-line driving NMOS transistor 31 is turned on, and the noise-killer transistor 15 connected to the transistor 31 is turned off. By contrast, when the word-line select signal is at the H level, the word-line driving NMOS transistor 31 is turned off, and the noise-killer transistor 15 connected to the transistor 31 is turned on.

FIG. 3 shows a cross section of each memory cell MC of the DRAM shown in FIG. 2. N+-type impurity-diffusion regions 41 and 42 are formed in the surface of a P-type semiconductor substrate 40 which is set at the ground potential VSS. The impurity-diffusion regions 41 and 42 are the drain region and source region of the NMOS transistor 10 (i.e., the transfer-gate transistor). A gate insulating layer 43 is formed on the surface of the substrate 40. The gate electrode WL (i.e., a word line) of the NMOS transistor 10 is embedded in the insulating layer 43. The charge storage node 11a of the capacitor 11 contacts the N+-type impurity-diffusion region 42. The plate electrode 11b of the capacitor 11 is formed on an insulating layer 11c. The insulating layer 11c of the capacitor 11 is that part of the layer which is sandwiched between the charge storage node 11a and the plate electrode 11b. A diode D is formed of the junction between the semiconductor substrate 40 and the source region 42.

FIG. 4 is a timing chart explaining how voltage stress testing is performed on the DRAM memory cell of FIG. 2.

With reference to FIG. 3 and FIG. 4, it will now be described how voltage stress testing is conducted on the DRAM of FIG. 2, thus achieving wafer burn-in screening. The voltage stress testing is performed by applying the power-supply voltage VCC to the DRAM and supplying a control signal to the switch control circuit 23 through a needle of a probe card put in contact with the pad 24 of the circuit 23.

Operating power is supplied to the DRAM, thus inactivating the row address strobe signal /RAS. As a result, the bit-line precharge signal generator (not shown) generates a precharge signal VEQ to the bit-line precharge circuit 12, turning on the circuit 12. All bit-line pairs BL are thereby precharged to the output potential of the bit-line precharge potential generating circuit 16. Then, all outputs of the word-line select circuit 13, are set at inactive level. The word-line driving NMOS transistor 31 is turned off, and the noise-killer transistor 15 is turned on. As a result, all word lines WL are set at the ground potential VSS.

When a control signal is supplied to the pad 24 thereafter, the negative pulse voltage is generated, turning the switch circuits 21 and 22 off and on, respectively. The negative pulse voltage is applied to the plate electrode of the capacitor 11 of every memory cells MC. If the plate electrode 11b is at the potential −Vb, the potential at the charge storage node 11a of the capacitor 11 falls from the substrate potential VSS to the potential −Vf (approx. −0.7 V). That is, VSS−Vf=−Vf, where Vf is the forward voltage drop Vf across the diode D. Thus, a voltage Vb−Vf, or (−Vf)−(−Vb), is applied across the capacitors 11 of all memory cells MC at the same time. The negative voltage −Vb has an absolute value greater than the forward voltage drop across the diode D which is a junction formed of the substrate 40 and the impurity-diffusion region 42.

At this time, the charge storage node 11a of the capacitor 11 is set at low impedance and is not in a floating state. Therefore, it is possible to supply a sufficient leak current, without changing the voltage (Vb−Vf) applied between the ends of the insulating layer 11c, when the insulating layer 11c of the capacitor 11 starts undergoing breakdown and a small leak current starts flowing. Hence, the insulating layer 11c can be broken down completely. As a result, any memory cell MC that is defective because of its capacitor insulating layer has broken down to some extent can be screened out with high efficiency.

When the plate potential changes from −Vb to VSS, the potential Vn on the charge storage node 11a of the capacitor 11 increases by −Vb due to the capacitive coupling of the capacitor 11, form the value of −Vf to Vb−Vf. Namely, (−Vf)+|−Vb|=Vb−Vf. A voltage of Vb−Vf is applied between the ends of the insulating layer 11c. At this time, the charge storage node 11a of the capacitor 11 is in a floating state. A voltage stress is exerted on the gate-source paths of all transfer-gate transistors 10 at the same time. This serves to enhance the screening efficiency remarkably.

In the conventional burn-in screening of, for example, a 4-M bit DRAM, a voltage stress is applied on only those transfer-gate transistors 10 connected to those four of 4096 word lines that are selected at the same time. By contrast, in the DRAM shown in FIG. 2, a voltage stress is simultaneously applied to all transfer-gate transistors 10 connected to all word lines WL. Obviously, the stress-applying efficiency is 1000 to 2000 times higher than in the conventional burn-in screening. In other words, the stress-applying time is 1000 to 2000 times shorter, and the transfer-gate transistors 10 of the memory cells MC can be screened at an enhanced efficiency.

In the embodiment described above, the noise-killer transistor 15 is located at one end of the word line WL and coupled between the ground node and the the word-line driving transistor 31. Nonetheless, the present invention can be applied to a DRAM in which the transistor 15 is arranged at the other end of the word line WL and connected between this end of the line WL and the ground node.

To set all word lines WL at the ground potential VSS, a single pad (not shown) can be connected to all word lines WL by switch elements (not shown), e.g., MOS transistors, and the ground potential can be applied to the pad while the switch elements are on. In this method, all word lines WL can be set at the ground potential VSS during the voltage stress testing, without supplying operating power to the DRAM, and a negative pulse voltage can be applied to the capacitor plates, thereby screening out defective memory cells MC.

The capacitor 11 of each memory cell MC is not limited to that type shown in FIG. 3. According to this invention, the capacitor 11 can be of trench type, stack type, or hybrid type which is a combination of the trench and stack types.

A DRAM according to a second embodiment of the present invention will now be described.

The DRAM according to the second embodiment is different from the first embodiment in that a negative-voltage generating circuit (not shown) is used in place of the negative pulse generating circuit 20. The negative-voltage generating circuit is designed to generates a DC voltage of negative potential (−Vb) in response to a control signal during voltage stress testing. The negative potential (−Vb) has an absolute value greater than the forward voltage drop across the junction formed between the substrate and the impurity-diffusion region contacting the charge storage electrode of the capacitor.

In the DRAM of the second embodiment of the invention, too, a DC voltage of a predetermined negative potential (−Vb) is generated in response to a control signal supplied to the DRAM, and is applied to the capacitor plates of all memory cells of the DRAM, during the voltage stress testing being performed on the DRAM which is still in a wafer form or is already packaged. Hence, like the DRAM of the first embodiment, the DRAM of the second embodiment can be screened, without requiring an external burn-in testing device having a negative power supply for supplying the negative voltage. Since a sufficient voltage stress is applied to the capacitor insulating layers of all memory cells at the same time, the insulating layers are broken down either completely or within a short time. It is therefore possible to detect the memory cells having a degradation mode, after the voltage stress testing by means of a simple functional test.

According to the invention, the plate potential generating circuit 18 can be re-designed to output such a negative pulse voltage or a negative DC voltage, as has been described. If this is the case, the negative pulse generating circuit 20 (or the negative-voltage generating circuit), the switch circuits 21 and 22 and the switch control circuit 23 can be dispensed with.

In the case where the DRAM of the invention is subjected to screening before it is cut from the semiconductor wafer, along with all other identical DRAMs formed on the same wafer, each DRAM need not have the negative pulse generating circuit 20 (or the negative-voltage generating circuit), the switch circuit 22 and the switch control circuit 23. Rather, it suffices to form these circuits on the wafer and to connect these circuits to some or all of the DRAMs formed on the wafer, by connecting wires which are formed on, for example, the dicing-line regions of the wafer. In this case, a single set of the negative pulse generating circuit 20 (or the negative-voltage generating circuit), the switch circuit 22 and the switch control circuit 23 serves to screen the memory cells incorporated in some or all of the DRAMs formed on the semiconductor wafer.

If only one negative pulse generating circuit 20 or only one negative-voltage generating circuit (not shown) is provided on the semiconductor wafer, for serving some or all of the DRAMs formed on the wafer, a voltage stress can be applied to the capacitor insulating layers 11c located in each DRAM chip region, merely by applying the ground potential VSS to the VSS terminals of the DRAM through the needle of a tester probe card. In this case, it is unnecessary to supply operating power to the DRAM while the voltage stress testing is being carried out to achieve wafer burn-in screening. This is because the voltage stress can be applied between the P-type semiconductor substrate 40 and the plate electrode 11b of each memory cell MC, since the electrode 11b receiving the output of the negative pulse generating circuit 20 or the negative-voltage generating circuit (not shown) is physically isolated from the substrate 40 to which the ground potential VSS is applied.

In the embodiments described above, the pad 24 for receiving a control signal can be a bonding pad. Instead, the pad 24 can be of any other type that can receive a voltage through a needle of a tester probe card contacting the pad 24 so that wafer burn-in screening may be performed on the DRAM. To accomplish package burn-in screening on the DRAM, that is, to carry out the burn-in screening after the DRAM chip has been cut from the wafer, the pad 24 can be of any type that can be electrically connected to a wire external of the DRAM chip.

The control signal can be supplied to achieve the voltage stress testing, in any one of the methods (a) to (e) specified below:

(a) To supply the signal to the pad 24 from an external device, while the DRAM is still on the wafer (b) To supply the signal to the DRAM through an external terminal not used during the normal operation of the DRAM, after the DRAM has been packaged (c) To generate the signal on the DRAM chip in response to an address key code supplied to the chip in WCBR (WE and CAS Before RAS) mode standardized by JEDEC (Joint Electron Device Engineering Council) for 4M DRAMs, in which mode a DRAM is put into test mode if both the WE (Write Enable) signal and the CAS (Column Address Strobe) signal are activated along with the RAS (Row Address Strobe) signal (d) To generate the signal by externally applying a voltage to a given terminal (which may not be used during the normal operation of the DRAM), said voltage falling outside the range of the normal operating voltage (e.g., 7 V if the power-supply potential VCC is 5 V)

(e) To generate the signal by supplying signals to the input terminals of the DRAM in a specific order in which these signals are never input during the normal operation of the DRAM FIG. 5 is a circuit diagram showing a high-voltage detecting circuit which generates a control signal upon detecting a voltage applied to any input terminal, which is higher than a power-supply voltage VCC.

As is shown in FIG. 5, the high-voltage detecting circuit comprises a control input terminal 51 (e.g., an address input terminal), two PMOS transistors 52 and 53, one NMOS transistor 54, and two inverters 55 and 56. The transistors 52, 53, and 54 are connected in series, forming a series circuit which is connected between the control input terminal 51 and the ground potential VSS. The drain and source of the transistor 52 are connected to each other. The power-supply voltage VCC is applied to the gates of the transistors 53 and 54. The inverters 55 and 56 are connected in series, with the former connected to the node of the transistors 53 and 54.

In operation, when an H-level potential (VCC) or an L-level potential (VSS) is applied to the address input terminal 51, the transistor 52 is turned off. The transistor 54, which is on, sets the input-node potential of the first-stage inverter 55 at the L level. The control signal TEST output from the second-stage inverter 56 is thereby set at the L level, or inactivated.

By contrast, when a control voltage higher than VCC+2 Vthp (where Vthp is the threshold voltage of the PMOS transistors 52 and 53) is applied to the address input terminal 51, the transistor 52 is turned on. The input-node potential of the first-stage inverter 55 thereby increases to VCC or more. The control signal TEST output from the second-stage inverter 56 is, therefore, set at the H level, or activated.

The embodiments described above are semiconductor memory devices each having a DRAM circuit. The present invention can, nevertheless, be applied to a semiconductor memory device (i.e., an embedded memory) which has a logical IC region containing a DRAM circuit.

Each of the above embodiments is one of the identical IC regions formed on a single semiconductor wafer, or one of the identical packaged IC chips prepared by cutting a semiconductor wafer. Nonetheless, the invention can be applied to a wafer-scale semiconductor device having a plurality of IC block regions which are electrically connected to one another.

Herein it has been explained how the semiconductor memory devices according to the invention are subjected to voltage stress testing for burn-in screening which implements both voltage acceleration and temperature acceleration. Needless to say, however, the memory devices of the invention can readily undergo voltage stress testing for screening which implements voltage acceleration only.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:

a plurality of memory cells arranged in rows and columns on a semiconductor substrate, each having one transistor and one capacitor;

a plurality of word lines each connected to said memory cells in the same row;

a plurality of bit lines each connected to said memory cells in the same column;

a plate voltage generating circuit for generating a capacitor plate voltage during normal operation;

a negative pulse generating circuit responsive to a control signal supplied thereto during voltage stress testing, for generating a pulse voltage of negative polarity;

a switch circuit for supplying the pulse voltage of negative polarity output from said negative pulse generating circuit to the plate electrodes of said capacitors of all memory cells simultaneously, in place of the output of said plate voltage generating circuit; and a switch control circuit responsive to said control signal supplied thereto during voltage stress testing, for controlling said switch circuit, wherein the semiconductor memory device is formed in a chip region of a semiconductor wafer, and wherein said negative pulse generating circuit is also provided for other chip regions of the same semiconductor wafer.

2. A semiconductor memory device comprising:

a plurality of memory cells arranged in rows and columns on a semiconductor substrate, each having one transistor and one capacitor;

a plurality of word lines each connected to said memory cells in the same row;

a plurality of bit lines each connected to said memory cells in the same column;

a plate voltage generating circuit for generating a capacitor plate voltage during normal operation;

a negative pulse generating circuit responsive to a control signal supplied thereto during voltage stress testing, for generating a DC voltage of negative potential;

a switch circuit for supplying the DC voltage of negative potential output from said negative voltage generating circuit to the plate electrodes of said capacitors of all memory cells simultaneously, in place of the output of said plate voltage generating circuit; and a switch control circuit responsive to said control signal supplied thereto during voltage stress testing, for controlling said switch circuit, wherein the semiconductor memory device is formed in a chip region of a semiconductor wafer, and wherein said negative pulse generating circuit is also provided for other chip regions of the same semiconductor wafer.

* * * * *

UNITED STATES PATENT AND TRADEMARK OFFICE
CERTIFICATE OF CORRECTION

PATENT NO. : 5,317,532
DATED : May 31, 1994
INVENTOR(S) : Kiyofumi OCHII It is certified that error appears in the above-identified patent and that said Letters Patent is hereby corrected as shown below:

Claim 2, column 12, line 16, change "pulse" to --voltage--.

Signed and Sealed this

Twenty-eight Day of February, 1995

Attest:

BRUCE LEHMAN

*Attesting Officer*           *Commissioner of Patents and Trademarks*